(12) United States Patent
Ban et al.

(10) Patent No.: US 9,478,436 B1
(45) Date of Patent: Oct. 25, 2016

(54) METHODS FOR FORMING PATTERNS IN HONEYCOMB ARRAY

(71) Applicant: SK hynix Inc., Gyeonggi-do (KR)

(72) Inventors: Keun Do Ban, Gyeonggi-do (KR); Young Sik Kim, Seoul (KR); Cheol Kyu Bok, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/089,257

(22) Filed: Apr. 1, 2016

(30) Foreign Application Priority Data

Dec. 23, 2015 (KR) .................. 10-2015-0184670

(51) Int. Cl.
| | |
|---|---|
| *H01L 21/8234* | (2006.01) |
| *H01L 21/311* | (2006.01) |
| *H01L 21/027* | (2006.01) |
| *H01L 21/02* | (2006.01) |
| *H01L 21/3213* | (2006.01) |
| *H01L 21/768* | (2006.01) |
| *H01L 21/033* | (2006.01) |
| *H01L 27/108* | (2006.01) |

(52) U.S. Cl.
CPC ..... *H01L 21/31144* (2013.01); *H01L 21/0271* (2013.01); *H01L 21/02118* (2013.01); *H01L 21/02318* (2013.01); *H01L 21/0337* (2013.01); *H01L 21/31111* (2013.01); *H01L 21/32139* (2013.01); *H01L 21/76802* (2013.01); *H01L 21/76816* (2013.01); *H01L 21/823475* (2013.01); *H01L 27/10844* (2013.01)

(58) Field of Classification Search
CPC .................. H01L 21/02365; H01L 21/02518
See application file for complete search history.

(56) References Cited

U.S. PATENT DOCUMENTS

| | | | |
|---|---|---|---|
| 8,357,606 B2 | 1/2013 | Chen et al. | |
| 8,962,491 B2 | 2/2015 | Ban et al. | |
| 2013/0068719 A1* | 3/2013 | Bonhote | ............... G11B 5/855 216/2 |
| 2015/0243525 A1* | 8/2015 | Park | ................. H01L 21/31144 438/703 |

* cited by examiner

*Primary Examiner* — Cheung Lee
(74) *Attorney, Agent, or Firm* — IP & T Group LLP

(57) ABSTRACT

A method for forming patterns includes forming ellipse pillars on an underlying layer. The ellipse pillar has an elongated feature and includes nose sides and long sides connecting the nose sides, and the four ellipse pillars form a diamond array around a separation space. A guide lattice attached to sides of the ellipse pillars is formed to open first windows in the separation space. Second windows are formed in the guide lattice by selectively removing the ellipse pillars. A block copolymer layer is formed to fill the first and second windows. The block copolymer layer is phase-separated to form a first domain and a first matrix in the first window and to form a plurality of second domains and second matrix in the second window. The first and second domains are selectively removed to form first openings and second openings.

20 Claims, 19 Drawing Sheets

FIG. 8
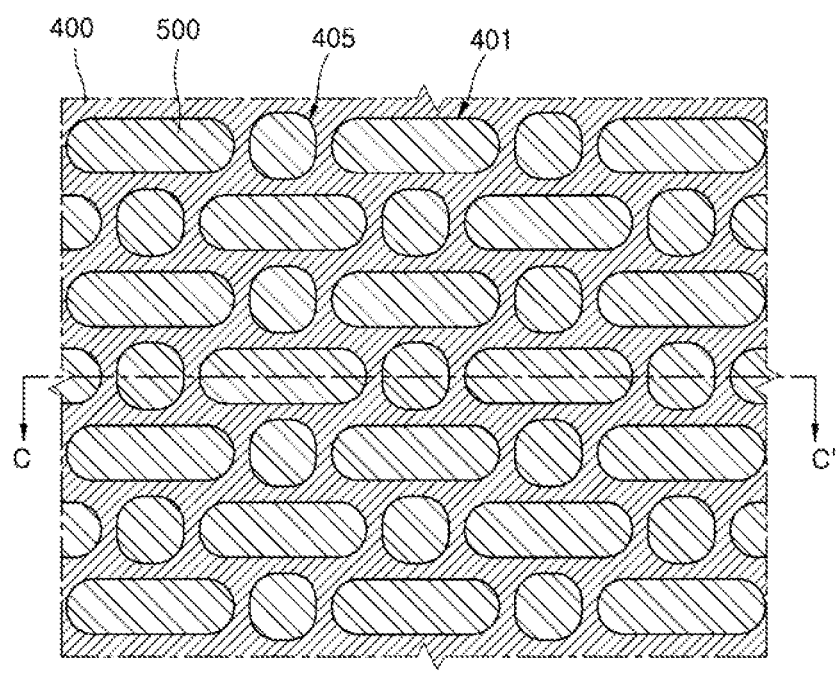
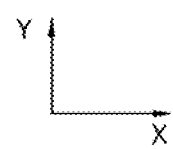

METHODS FOR FORMING PATTERNS IN HONEYCOMB ARRAY

CROSS-REFERENCE TO RELATED APPLICATION

The present application claims priority under 35 U.S.C 119(a) to Korean Patent Application No. 10-2015-0184670, filed on Dec. 23, 2015, which is herein incorporated by reference in its entirety.

BACKGROUND

1. Technical Field

Various embodiments of the present disclosure relate to a semiconductor technology and, more particularly, to methods for forming fine patterns in honeycomb arrays.

2. Related Art

As the semiconductor industry is growing rapidly, efforts to implement more integrated circuits with high device density have been made. In order to decrease an area that a unit cell of semiconductor device occupies and to integrate more devices in a limited area of a semiconductor substrate, various techniques have been tried which implement a pattern with a critical dimension (CD) as small as a few nanometers to several tens of nanometers.

When fine patterns of the semiconductor devices are formed using only a photolithography process, there may be some limitations in forming the fine patterns due to image resolution limits of an optical system and a wave length of an exposure light source used in the photolithography process. In order to overcome the exposure resolution limits or the image resolution limits, non-photolithography patterning technique has been tried. For instance, methods using self-assembly characteristics of polymer molecules and phase-separation of block copolymer materials have been tried.

SUMMARY

According to an embodiment, there is provided a method for forming patterns. The method includes forming ellipse pillars on an underlying layer. Each of the ellipse pillars has an elongated feature and includes nose sides and long sides connecting the nose sides, and the four ellipse pillars form a diamond array around a separation space. A guide lattice is formed to be attached to sides of the ellipse pillars and to open first windows in the separation space. Second windows are formed in the guide lattice by selectively removing the ellipse pillars. A block copolymer layer is formed to fill the first and seconds. The block copolymer layer is phase-separated to form a first domain and a first matrix in the first window and to form a plurality of second domains and second matrix in the second window. The first and second domains are selectively removed to form first openings and second openings.

According to an embodiment, there is provided a method for forming patterns. The method includes forming a guide lattice having laterally elongated second window on the underlying layer. The second windows are disposed to surround a first window and to form a diamond array. A block copolymer layer is formed to fill the first and second window. The block copolymer layer is phase-separated to form a first domain and a first matrix in the first window, and a plurality of second domains and second matrixes in the second window. The first and second domains are selectively removed to form first openings and second openings.

According to an embodiment, there is provided a method for forming patterns. The method includes forming ellipse pillars including nose sides and long sides connecting the nose sides and having an elongated feature on an underlying layer so that the nose sides face each other and the long sides face diagonally each other, and separation spaces are located between the opposite nose sides. A guide lattice attached to sides of the ellipse pillars and opening first windows is formed in the separation space. Second windows are formed in the guide lattice by selectively removing the ellipse pillars. A block copolymer layer is formed to fill the first and second windows. The block copolymer layer is phase-separated to form a first domain and a first matrix in the first window, and to form a plurality of second domains and second matrixes in the second window. The first and second domains are selectively removed to form first openings and second openings.

BRIEF DESCRIPTION OF THE DRAWINGS

Various embodiments of the present disclosure will become more apparent in view of the attached drawings and accompanying detailed description, in which:

FIGS. 1 to 18 are schematic views illustrating a method for forming patterns according to an embodiment.

DETAILED DESCRIPTION OF THE EMBODIMENTS

Figure 1:
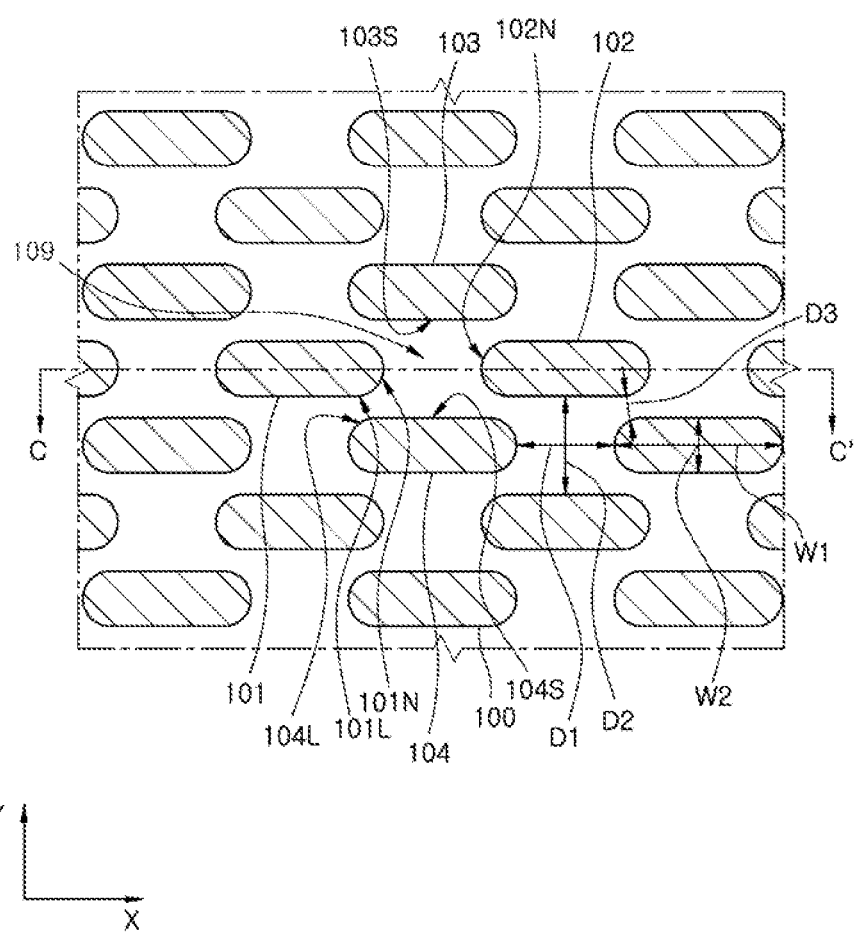

The terms used herein may correspond to words selected in consideration of their functions in the embodiments, and the meanings of the terms may be construed differently according to one of ordinary skill in the art to which the embodiments belong. If defined in detail, the terms may be construed according to the definitions. Unless otherwise defined, the terms including technical and scientific terms, used herein may have the same meaning as commonly understood by one of ordinary skill in the art to which the embodiments belong.

In the following description of the embodiments, it will be understood that the terms "first" and "second", "top" and "bottom or lower" are intended to identify the member, but not used to define only the member itself or to mean a particular sequence. In addition, it is intended to mean a relative position relationship, but is not used to limit certain cases in which the element directly contacts the other element, or at least one intervening element is present therebetween. Other words used to describe the relationship between elements or layers should be interpreted in a like fashion.

The term "honeycomb array" used in description of the following embodiments may refer an arrangement type of patterns arranged in a "dense array". The patterns of the honeycomb array may have a relatively short spacing distance therebeween, and may be arranged to substantially have regularity and have a relatively small pitch size. The term "honeycomb array" may be an arrangement type in which patterns are disposed at six vertices of hexagon and another one pattern is disposed at a substantially inner center of the hexagon. The "honeycomb array" may be an arrangement type in which patterns can be disposed in the highest density with a substantially same pitch. The "honeycomb array" may be applied to semiconductor manufacturing techniques to improve the integration of the integrated circuit since patterns may be arranged in the highest density within the limited area. The patterns arranged in the "honeycomb array" may have substantially the same size and spacing distance therebetween.

In some embodiments of the present disclosure are methods for forming patterns having a line width less than resolution limits of optical exposure apparatus used in photolithography. The methods utilize a self-assembly property and a phase-separation property of a block co-polymer (BCP) layer.

The BCP layer may be directly self-assembled (DSA) on a target layer, and certain polymer blocks constituting the BCP layer may be rearranged and phase-separated to form domains. Part of the domains, which are created upon the phase-separation, may be selectively removed to form a nano-scale feature. The nano-scale feature may be a structure having a size of about a few nanometers to about several tens of nanometers.

The self-assembled structure of the BCP layer may have a cylindrical shape or a lamellar shape according to volume ratio of polymer blocks constituting the BCP layer, a temperature for the phase-separation, molecule sizes of the polymer blocks constituting the BCP layer, and molecular weights of the polymer blocks constituting the BCP layer. When the self-assembled structure of the BCP layer has a cylindrical shape, the structure may be used, for example, to form an opening hole array. In addition, when the self-assembled structure of the BCP layer has a lamellar shape, the structure may be used, for example, to form repeated line and space patterns.

Various embodiments of the present disclosure may be applied to fabrication of highly integrated semiconductor devices, for example, dynamic random access memory (DRAM) devices, phase changeable random access memory (PcRAM) devices, or resistive random access memory (ReRAM) devices. In addition, the embodiments may be applied to fabrication of memory devices such as static random access memory (SRAM) devices, flash memory devices, magnetic random access memory (MRAM) devices, or ferroelectric random access memory (FeRAM) devices. The embodiments may also be applied to fabrication of logic devices in which logic integrated circuits are integrated.

Same reference numerals refer to same elements throughout the specification. Thus, even though a reference numeral is not mentioned or described with reference to a drawing, the reference numeral may be mentioned or described with reference to another drawing. In addition, even though the reference numerals are not shown in a drawing, it may be mentioned or described with reference to another drawing.

Figure 2:
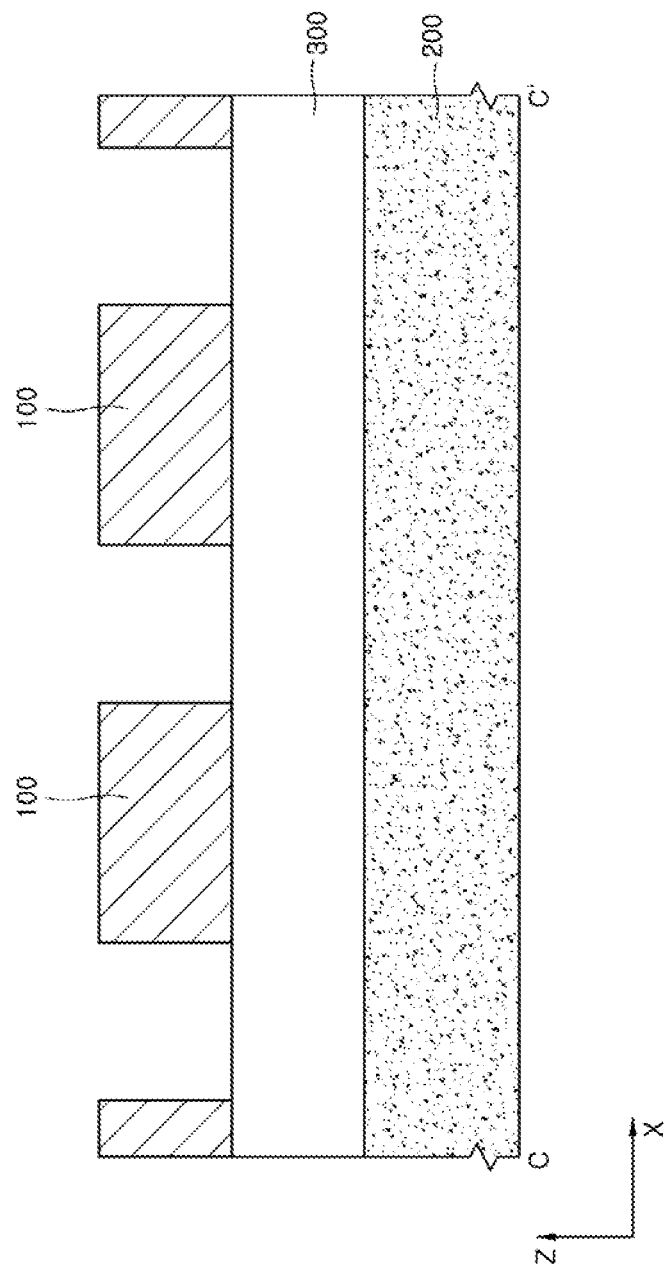

FIGS. 1 and 2 illustrate a step of forming arrays of ellipse pillars 100. FIG. 1 is a plan view illustrating a step of forming arrays of ellipse pillars 100 and FIG. 2 is a cross-sectional view taken along the line C-C' of FIG. 1.

Referring to FIGS. 1 and 2, the ellipse pillars 100 are formed to be arranged on an underlying of a substrate 200. A plurality of the ellipse pillars 100 may extend in the Z-axis direction which is substantially perpendicular to the XY-plan of the substrate 200. Each of the ellipse pillars 100 may have a laterally elongated feature on the XY-plan. For example, the ellipse pillar 100 has a planar feature. The ellipse pillar 100 extends in an X-axis direction and has a relatively large width W1 in the X-axis direction, and has a relatively small width W2 in a Y-axis direction perpendicular to the X-axis direction.

FIG. 1 is a plan view. Each of the ellipse pillars 100 may have an asymmetrical shape. That is, each of the ellipse pillars 100 has different line widths according to directions. The line width W1 in the X-axis direction of the ellipse pillar 100 is different from the line width W2 in the Y-axis direction. The major-axis width W1 of the ellipse pillar 100 may be 1.5-3 times greater than the minor-axis width W2. The major-axis width W1 of the ellipse pillar 100 may be approximately two times greater than the minor-axis width W2. The ellipse pillar 100 may have a pillar shape or a pole shape. The ellipse pillar 100 has an asymmetrical cross-sectional feature since the line width W1 of the X-axis direction and the line width W2 of the Y-axis direction are different from each other. In a plan view, the ellipse pillar 100 may have an elongated rectangular shape, an elongated diamond shape, or an oval shape. In some cases, the ellipse pillar 100 may have an elongated cross shape in a plan view.

The ellipse pillars 100 may be arranged to have laterally elongated features on the XY-plan. For example, a first ellipse pillar 101 and a second ellipse pillar 102 may be disposed so that a first nose side 101N and a second nose side 102N are facing each other. The first nose side 101N and the second nose side 102N are located at end portions of the first ellipse pillar 101 and the second ellipse pillar 102 of the large width W1. The first ellipse pillar 101 and the second ellipse pillar 102, for example, may be disposed to face each other along the X-axis direction and to be elongated in the X-axis direction.

The first ellipse pillar 101 and the second ellipse pillar 102 may be disposed along the X-axis direction so that the first nose side 101N and the second nose side 102N are spaced apart from each other by a first spacing distance D1. The first spacing distance D1 has a smaller size than the major-axis width W1 of the ellipse pillar 100. The first spacing distance D1 has a greater size than the minor-axis width W2 of the ellipse pillar 100.

A third ellipse pillar 103 and a fourth ellipse pillar 104 may be disposed to be adjacent to the first ellipse pillar 101 and the second ellipse pillar 102. The third ellipse pillar 103 and the fourth ellipse pillar 104 may be spaced apart from each other in the Y-axis direction. The first ellipse pillar 101, the second ellipse pillar 102, the third ellipse pillar 103, and the fourth ellipse pillar 104 may be disposed at four vertices of a diamond shape or a rhombus shape. The first ellipse pillar 101 and the second ellipse pillar 102 are located at the same row. The third ellipse pillar 103 may be disposed at a higher row than each of the first ellipse pillar 101 and the second ellipse pillar 102. The third ellipse pillar 103 may be disposed at a lower row than each of the first ellipse pillar 101 and the second ellipse pillar 102.

The first ellipse pillar 101, the third ellipse pillar 103 and the second ellipse pillar 102 may be arranged in a zig-zag manner along the X-axis direction. The fourth ellipse pillar 104 may be aligned with the third ellipse pillar 103. The fourth ellipse pillar 104 may be spaced apart from the third ellipse pillar 103 by a second spacing distance D2 and by a separation space 109 between the opposite nose sides 101N and 102N of the first and second ellipse pillars 101 and 102. One ellipse pillar 100 may have a gentle or long side 103S or 104S substantially perpendicular to the nose side 101N or 102N which is a sharply curved side or a short side of the end portion of the major-axis direction.

The fourth ellipse pillar 104 may be aligned with the third ellipse pillar 103 such that a first long side 104S of the fourth ellipse pillar 104 faces a second long side 103S of the third ellipse pillar 103.

The four ellipse pillars 101, 102, 103 and 104 forming a diamond shape may be disposed to surround the separation space 109, which is at the center of the diamond shape. The central separation space 109 may be set as a space having the first spacing distance D1 and the second spacing distance D2 perpendicular to the first spacing distance D1. The central separation space 109 faces the nose sides 101N and 102N in the X-axis direction and faces the long sides 103S and 104S in the Y-axis direction. The second spacing distance D2 has a smaller size than the major-axis width W1 of the ellipse pillar 100. The second spacing distance D2 has a greater size than the minor-axis width W2 of the ellipse pillar 100. The second spacing distance D2 has substantially the same size as the first spacing distance D1.

Since the four ellipse pillars 101, 102, 103 and 104 form a diamond shape and surround the separation space 109, the fourth ellipse pillar 104 may be located at a position spaced apart from the first ellipse pillar 101 such that a corner portion 101L of an end portion of the major-axis direction of the first ellipse pillar 101 and a corner portion 104L of an end portion of the major-axis direction of the fourth ellipse pillar 104 face each other. That is, the first, the third, and the fourth ellipse pillars 101, 103 and 104 are disposed such that a part of the end portion of the fourth ellipse pillar 104 and a part of the end portion of the third ellipse pillar 103 are overlapped with the end portion of the first ellipse pillar 101 in the Y-axis direction.

The corner portion 101L of the end portion of the first ellipse pillar 101 of the major-axis direction and the corner portion 104L of the end portion of the fourth ellipse pillar 104 of the major-axis direction may face each other and may be spaced apart from each other by a third spacing distance D3. The third spacing distance D3 may be set as a spacing distance between the first ellipse pillar 101 and the fourth ellipse pillar 104 that are disposed in parallel. The third spacing distance D3 may be set as a smaller size than the first spacing distance D1 or the second spacing distance D2. The third spacing distance D3 may be set as a smaller size than half of the first spacing distance D1 or half of the second spacing distance D2.

Referring to FIG. 2 and FIG. 1, the array of the ellipse pillars 100 may be formed on an underlying layer 300. The underlying layer 300 is formed over the substrate 200. The substrate 200 may include a semiconductor layer in which integrated circuits are to be integrated. The substrate 200 may be a silicon (Si) substrate or a wafer. The underlying layer 300 disposed on the substrate 200 may be a patterning target layer. The underlying layer 300 may be a layer which is etched using a hard mask or an etch mask in a semiconductor fabricating process. The underlying layer 300 may be an inter-layer dielectric (ILD) layer or an inter-metal dielectric (IMD) layer. The underlying layer 300 may be a metal layer or a conductive layer for interconnection. The underlying layer 300 may be a layer for a template or a damascene mold which provides a certain shape for patterning. The underlying layer 300 may have such a structure that layers of different materials are laminated in a multi-layer to form a multi layered hard mask system. The underlying layer 300 may be a semiconductor substrate or a semiconductor layer.

The underlying layer 300 may be formed of an inter-layer dielectric (ILD) layer including silicon oxide, such as a tetraethyl orthosilicide (TEOS) layer, having a thickness, for example, of about 2200 Å. Alternatively, the underlying layer 300 may include a silicon oxynitride (SiON) layer of about 300 Å to about 350 Å thickness, and may include an amorphous spin on carbon (SOC) layer with a thickness of about 730 Å to about 1000 Å as a bottom layer (not illustrated) thereof.

A pillar layer including a spin on carbon layer having about a 700 Å to about 800 Å thickness is formed on the underlying layer 300 to form the ellipse pillars. The pillar layer is patterned using a patterning process including a photolithography process. As a result, the array of the ellipse pillars 100 may be formed.

A photoresist layer (not illustrated) for the photolithography process is formed on the pillar layer. Selective exposure and development processes using the photoresist pattern (not illustrated) are performed to form a photoresist pattern (not illustrated). The photoresist pattern (not illustrated) may be used as an etch mask which provides the array patterns of the ellipse pillars 100 illustrated in FIG. 1 to the pillar layer.

Portions of the pillar layer exposed by the photoresist pattern are selectively etched to form the ellipse pillar 100 arrays on the underlying layer 300. The etching mask including the photoresist pattern may be formed by exposing and developing the photoresist layer at a time without using a double-patterning technique that is complex and requires a plurality of photolithography processes.

Figure 3:
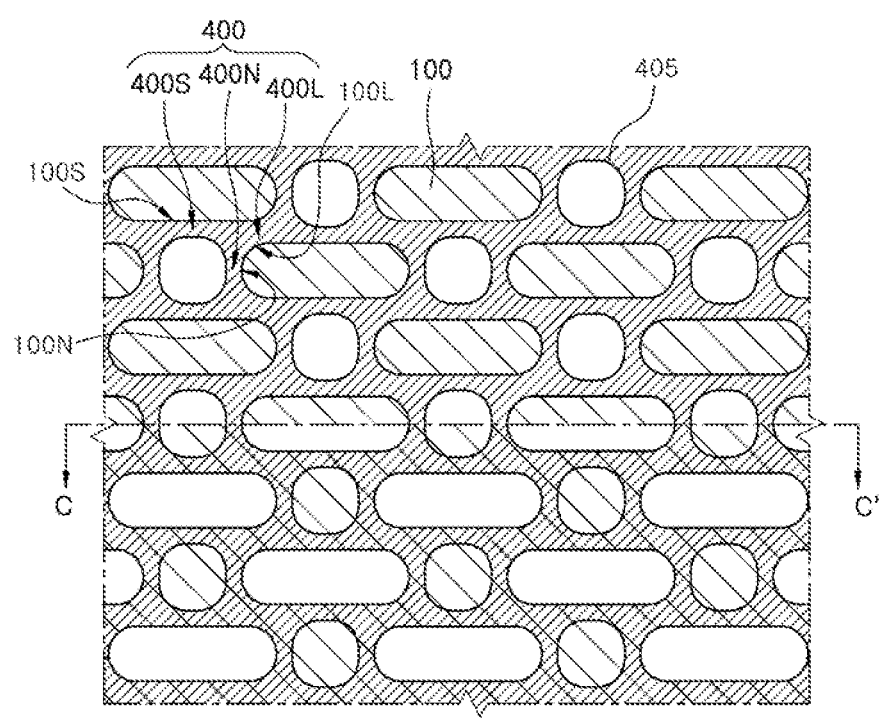
Figure 4:
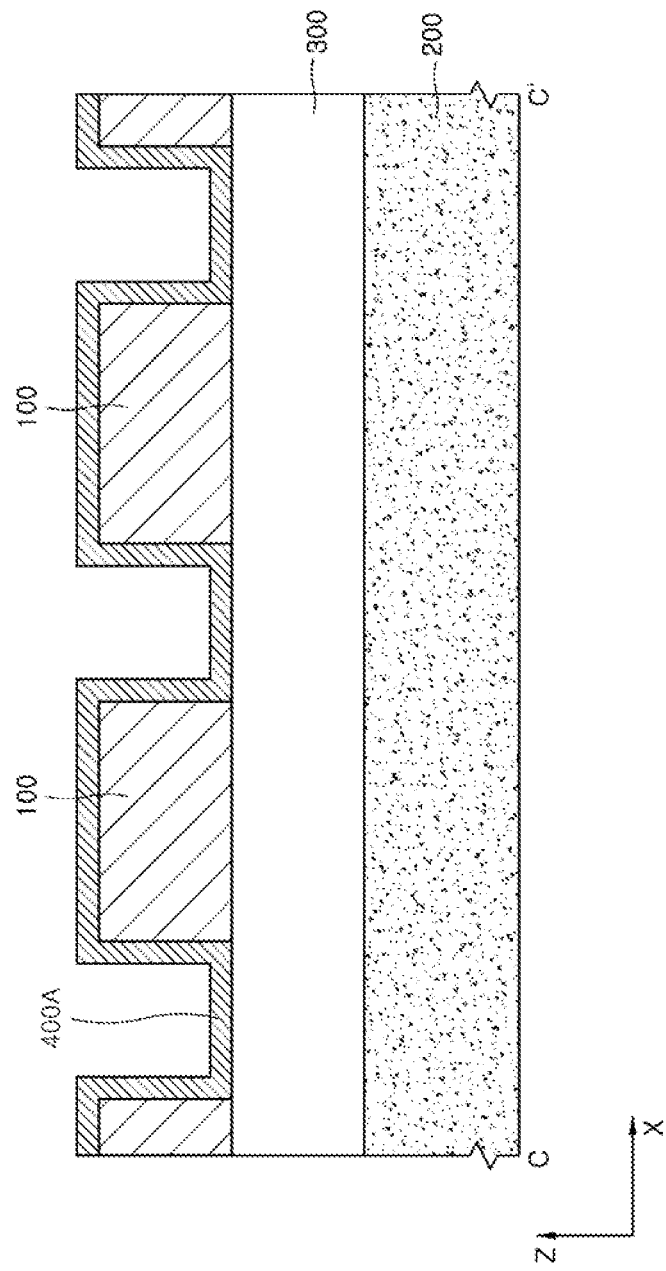
Figure 5:
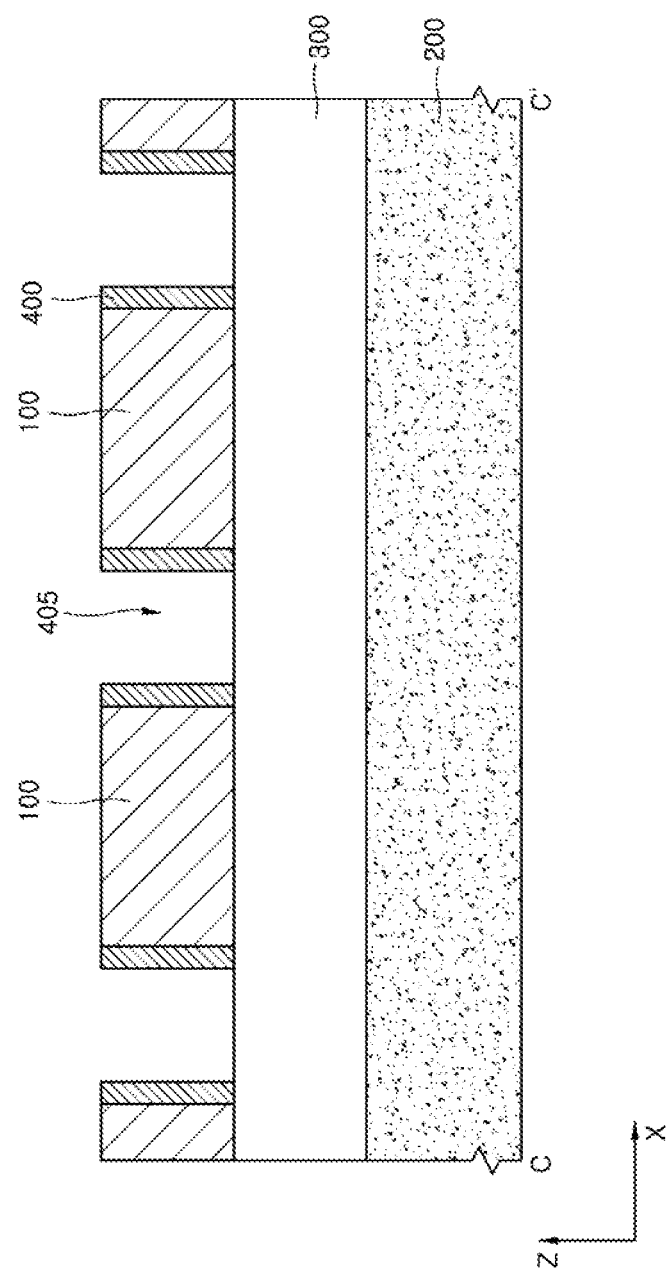

FIGS. 3 to 5 illustrate a step of forming a guide lattice 400, and FIGS. 4 and 5 illustrate cross-sectional views taken along line C-C' in FIG. 3.

As shown in FIG. 5, a plurality of the guide lattices 400 in a spacer shape are formed on each side wall of the ellipse pillars 100. As shown in FIG. 4, a guide layer 400A is formed to cover the ellipse pillars 100. The guide layer 400A covers side surfaces and top surfaces of the ellipse pillars 100, and may extend to cover the exposed portion of the underlying layer 300 which is exposed by the ellipse pillars 100. As shown in FIG. 4, the guide layer 400A for forming the guide lattice 400 may formally cover the ellipse pillars 100. The guide layer 400A may be formed of a dielectric material having an etching selectivity with respect to the ellipse pillars 100 and the underlying layer 300. For example, the guide layer 400A may be formed by forming an ultra-low temperature oxide (ULTO) layer and have a thickness of approximately about 200 Å.

An anisotropic etching process or a spacer etching process is performed to the guide layer 400A to form the guide lattice 400 on the side walls of the ellipse pillars 100. In the spacer etching process, portions of the guide layer 400A which cover the top surfaces of the ellipse pillars 100 are removed and portions of the guide layer 400A of FIG. 4 that cover the side surfaces of the ellipse pillars 100 remain. The spacer etching process may be performed to remove the portions of the underlying layer 300 exposed by the guide layer 400A. The guide lattice 400 may have a feature attached to the side surfaces of the ellipse pillars 100 like spacers.

As shown in FIG. 3, the guide lattice 400 may be formed to provide first windows 405 between the two opposite nose sides 100N of the ellipse pillars 100. The guide layer (400A of FIG. 4) for forming the guide lattice 400 is formed. The guide layer (400A of FIG. 4) may not fill the central separation spaces (109 of FIG. 1) between the ellipse pillars 100. The guide layer 400A may surround the ellipse pillars 100 in a conformal manner so that the first windows 405 are formed in a center of the separation spaces 109.

The guide lattice 400 may be formed to fill the spaces between each of the ellipse pillars 100 except the first windows 405. The guide lattice 400 may be controlled to fill the spaces between the ellipse pillars 100 except the first windows 405 by adjusting the deposition thickness of the guide layer (400A of FIG. 4). In addition, the diameter or line width of the first windows 405 can vary by controlling the deposition thickness of the guide layer (400A of FIG. 4).

As shown in FIG. 3, the guide lattice 400 may be formed to provide the first windows 405 in the center of a diamond array formed by the four ellipse pillars 100. The first window 405 may have a circular shape, an oval shape, or a rectangular shape in a plan view. In a plan view, the first window 405 may have a shape of a star that has sharp corners at portions close to the long side 100S of other ellipse pillars 100 adjacent to the nose side 100N of the ellipse pillar 100.

As shown in FIG. 3, the guide lattice 400 may include first partition wall portions 400N covering the nose sides 100N of the ellipse pillars 100 and isolating the nose sides 100N of the ellipse pillars 100 from the first windows 405. The guide lattice 400 may include second partition wall portion 400S covering the long sides 100S of the ellipse pillars 100 and isolating the long sides 100S of the ellipse pillars 100 from the first windows 405. The guide lattice 400 may include a third partition wall portion 400L covering the side 100L of an end of the long axis direction of the ellipse pillar 100 and isolating the ellipse pillars 100 from each other in the diagonal direction.

The guide lattice 400 may have a lattice shape. The guide lattice 400 may isolate the ellipse pillars 100 from each other, and may open the first windows 405 between one ellipse pillar 100 and adjacent ellipse pillars 100.

Figure 6:
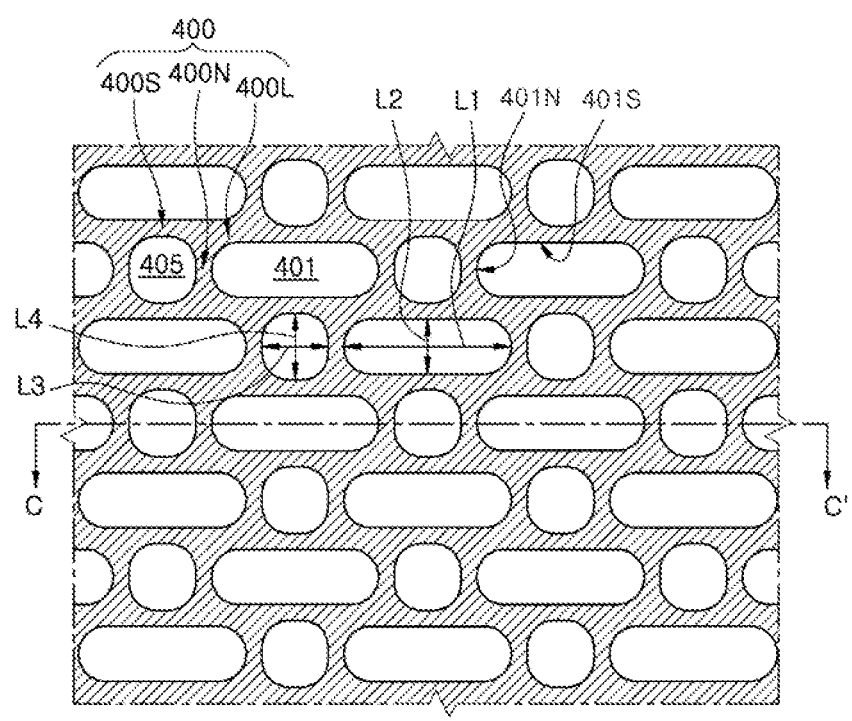
Figure 7:
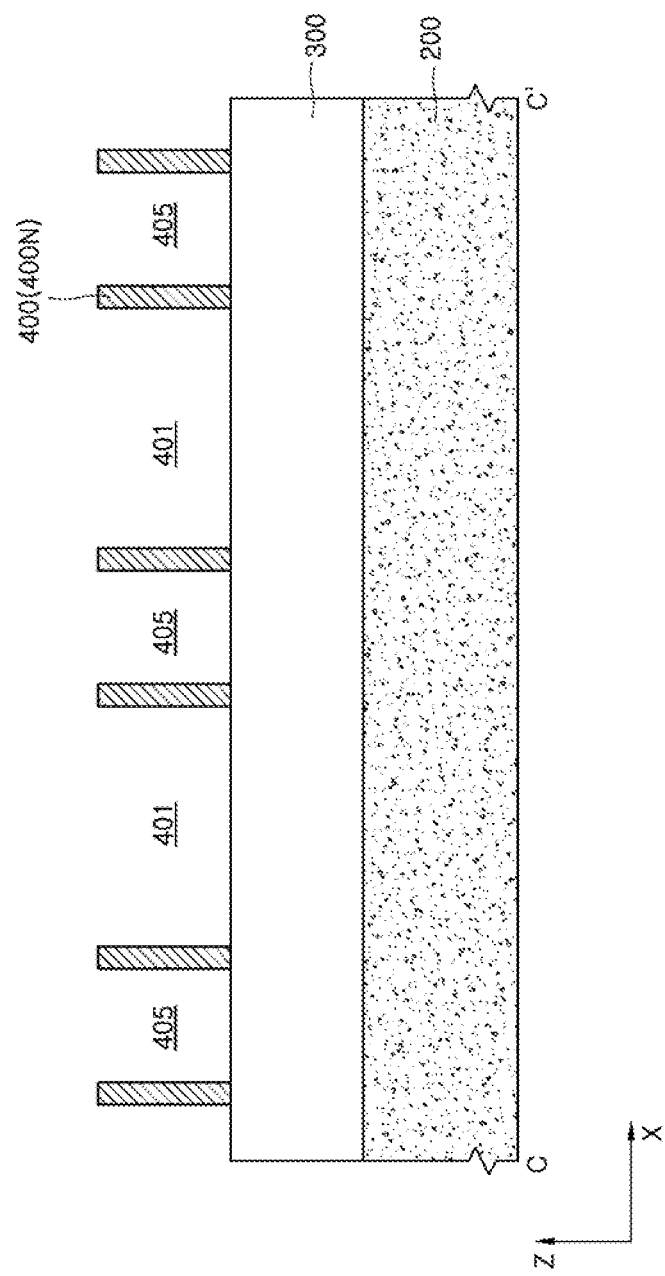

FIGS. 6 and 7 illustrate a step of removing the ellipse pillars 100, and FIG. 7 is a cross-sectional view taken along the line C-C' in FIG. 6.

As shown in FIGS. 6 and 7, a guide lattice 400 is formed by removing the ellipse pillars (100 of FIG. 5). As a result, the guide lattice 400 opens the second windows 401. Since the second windows 401 of the guide lattice 400 are formed by removing the ellipse pillars (100 of FIG. 5), the second windows 401 have the same shape as the ellipse pillars (100 of FIG. 5).

The second window 401 may include a nose side 401N corresponding to the nose side 100N of the ellipse pillar (100 of FIG. 5), and may include a long side 401S corresponding to the long side 100S of the ellipse pillar (100 of FIG. 5). The second window 401 may have a long width L1 of the major axis direction corresponding to the long width (W1 of FIG. 1) of the major axis direction of the ellipse pillar (100 of FIG. 1) and a short width 12 of the minor axis direction corresponding to the short width (W2 of FIG. 1) of the minor axis direction of the ellipse pillar (100 of FIG. 1).

Since the second window 401 has the same shape as the ellipse pillar 100, it may have a feature elongated in a certain direction on the XY-plan. For instance, the second window 401 may have an asymmetrical cross-sectional shape in that the line width L1 of the X-axis direction and the line width L2 of the Y-axis direction are different from each other. For example, the second window 401 may have an oval cross-sectional shape. As long as the second window 401 has the asymmetrical cross-sectional shape and the line width L1 of the X-axis direction and the line width L2 of the Y-axis direction are different from each other, it may have a rectangular feature or a diamond feature in a plan view. In some cases, the second window 401 may have a cross feature.

The guide lattice 400 may open the second windows 401 and the first windows 405 so that the first windows 405 are disposed between the second windows 401 along a certain direction, for example, the X-axis direction. The guide lattice 400 may open the second windows 401 and the first windows 405 so that the first windows 405 are located at positions adjacent to the long sides 401S of the second windows 401 in the Y-axis direction perpendicular to the X-axis direction. The first windows 405 may be spaced apart from the first windows 405 in the Y-axis direction that is a minor axis direction of the first window 405. Four first windows 405 may be disposed to form a diamond formation around the second window 401. Four second windows 401 may be disposed to form a diamond formation around the first window 405.

The first window 405 has a line width L3 in the X-axis direction which is a major axis direction of the second window 401, and has a line width L4 in the Y-axis direction which is a minor axis direction of the second window 401. The first window 405 may have a symmetrical feature in that the line width L3 and the line width L4 are substantially equal to each other. The line width L3 or L4 of the first window 405 may be similar to or may substantially be equal to the short line width L2 of the second window 401. Alternatively, the line width L3 or L4 of the first window 405 may have slightly larger or slightly smaller than the short line width L2 of the second window 401. In a plan view, the first window 405 may be a square, a circle, a diamond, or a star.

Figure 9:
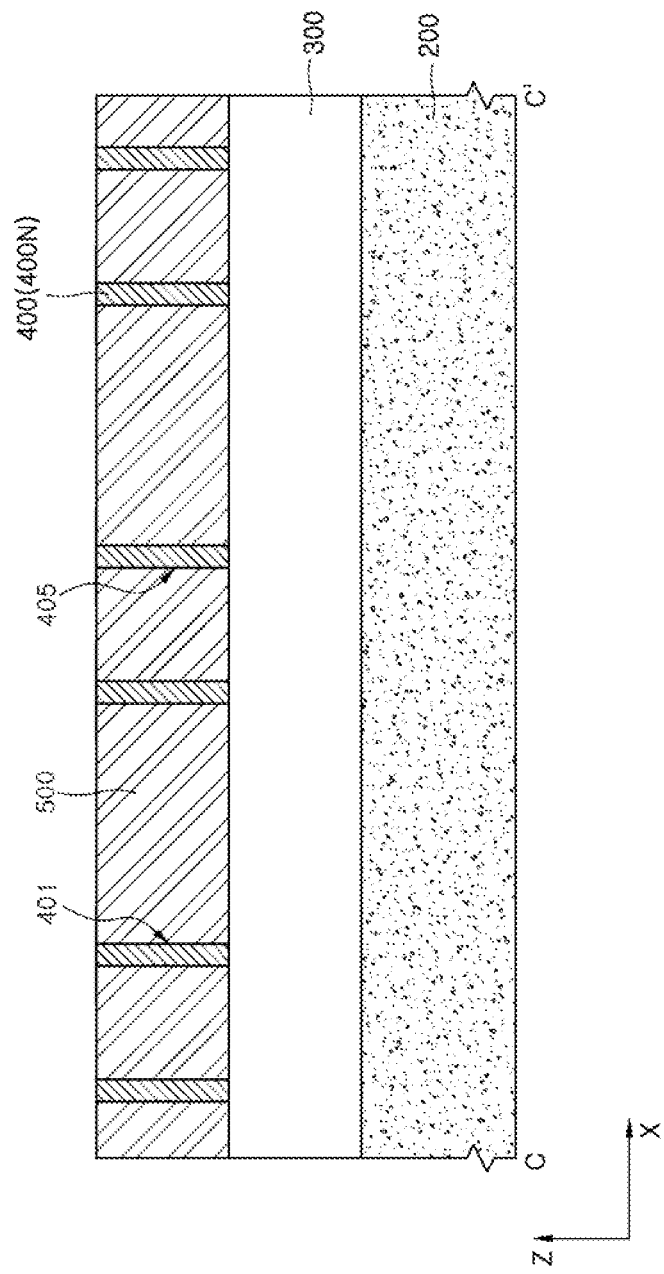

FIGS. 8 and 9 illustrate a step of forming the block co-polymer (BCP) layer 500, and FIG. 9 is a cross-sectional view taken along the line C-C' in FIG. 8.

As shown in FIGS. 8 and 9, the BCP layer 500 is formed to fill the first windows 405 and the second windows 401 of the guide lattice 400. The BCP layer 500 may include a polystyrene-poly(meta methyl acrylate) block copolymer (PS-b-PMMA) material or a polystyrene-poly(di methyl siloxane) (PS-PDMS) block copolymer material. The BCP forming the BCP layer 500 may include first and second blocks which are subject to phase separation and form distinctive domains. Upon separation, the first blocks are rearranged to form the first domains and the second blocks are rearranged to form the second domain. In an embodiment, the first domain may be dispersed in the second domain. In an embodiment, a volume of the second blocks may be approximately about 25 vol. % to about 40 vol. % in a total volume of the first and the second blocks. For example, in the event that the BCP layer 500 is formed of a PS-b-PMMA, PS blocks may serve as the first blocks and PMMA blocks may serve as the second blocks. The volume of the PMMA blocks over the total volume of the PS blocks and the PMMA blocks may be about 25 vol. % to about 40 vol. %. The volume ratio of the PS blocks and the PMMA blocks may vary according to a process scheme. Also, the molecular weights of the PS blocks and the PMMA blocks may vary according to a process scheme.

The BCP layer 500 may be a functional polymer material. In the BCP layer 500, two or more distinct polymer blocks are combined with each other by a covalent bond to constitute the block copolymer material, as illustrated in FIG. 19.

Figure 19:
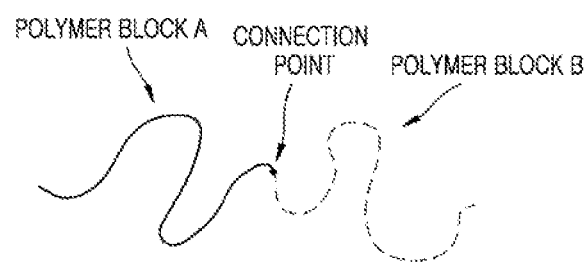
FIGS. 19 to 20 are schematic views illustrating phase-separations of block copolymer (BCP) layers used in some embodiments.
Figure 20:
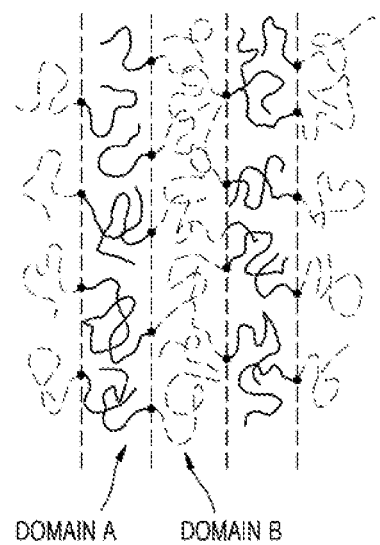

FIGS. 19 to 20 are schematic views illustrating phase separations of the BCP layers. As illustrated in FIG. 19 showing a single BCP layer, the BCP layer may have a shape of chain-type polymer in which a polymer block component 'A' and a polymer block component 'B' are connected to each other in a connecting point by a covalent bond. The BCP layer may be coated in a state that the polymer blocks are mixed in a homogeneous phase, as illustrated in FIG. 20. Each polymer block constituting the BCP layer may have different miscibility and different solubility from each other due to a difference between chemical structures thereof.

The polymer block components may be immiscibly separated from the mixed state and rearranged by an annealing process, and therefore may be phase-separated. The BCP layer having a homogeneous phase may be phase-separated into a domain 'A' composed of the rearranged polymer blocks 'A' and a domain 'B' composed of the rearranged polymer blocks 'B' by an annealing process, as illustrated in FIG. 20 showing the phase-separation.

For example, the domain 'A' may have a lower solubility than the matrix domain 'B', and may be selectively removed in a subsequent process. For example, the matrix domain 'B' may be patterned and the domain 'A' is removed. As such, polymer blocks of the BCP layer may be phase-separated or selectively dissolved in a liquid state or in a solid state to form a self-assembled structure.

Forming a fine structure of a specific feature through a self-assembly of the BCP layer may be influenced by a physical property and/or a chemical property of the polymer blocks of the BCP layer. When a BCP layer consisting of two distinct polymer blocks is self-assembled on a substrate, the self-assembled structure of the BCP layer may be formed to have a three dimensional cubic shape, a three dimensional double helix shape, a two dimensional dense hexagonal packed column shape, and a lamella shape according to an amount ratio of the polymer blocks constituting the BCP layer, an annealing temperature for phase-separation of the BCP layer, and molecule size of the polymer blocks constituting the BCP layer.

In some embodiments, the BCP layer may include polybutadiene-polybutylmethacrylate block copolymer, polybutadiene-polydimethylsiloxane block copolymer, polybutadiene-polymethylmethacrylate block copolymer, polybutadienepolyvinylpyridine block copolymer, polybutylacrylate-polymethylmethacrylate block copolymer, polybutylacrylate-polyvinylpyridine block copolymer, polyisoprene-polyvinylpyridine block copolymer, polyIsoprene-polymethylmethacrylate block copolymer, polyhexylacrylate-polyvinylpyridine block copolymer, polyisobutylene-polybutylmethacrylate block copolymer, polyisobutylene-polymethylmethacrylate block copolymer, polyisobutylene-polybutylmethacrylate block copolymer, polyisobutylene-polydimethylsiloxane block copolymer, polybutylmethacrylate-polybutylacrylate block copolymer, polyethylethylene-polymethylmethacrylate block copolymer, polystyrene-polybutylmethacrylate block copolymer, polystyrene-polybutadiene block copolymer, polystyrene-polyisoprene block copolymer, polystyrene-polydimethylsiloxane block copolymer, polystyrene-polyvinylpyridine block copolymer, polyethylethylene-polyvinylpyridine block copolymer, polyethylene-polyvinylpyridine block copolymer, polyvinylpyridine-polymethylmethacrylate block copolymer, polyethyleneoxide-polyisoprene block copolymer, polyethyleneoxide-polybutadiene block copolymer, polyethyleneoxide-polystyrene block copolymer, polyethyleneoxide-polymethylmethacrylate block copolymer, polyethyleneoxide-polydimethylsiloxane block copolymer, polystyrene-polyethyleneoxide block copolymer, or a combination thereof.

Figure 10:
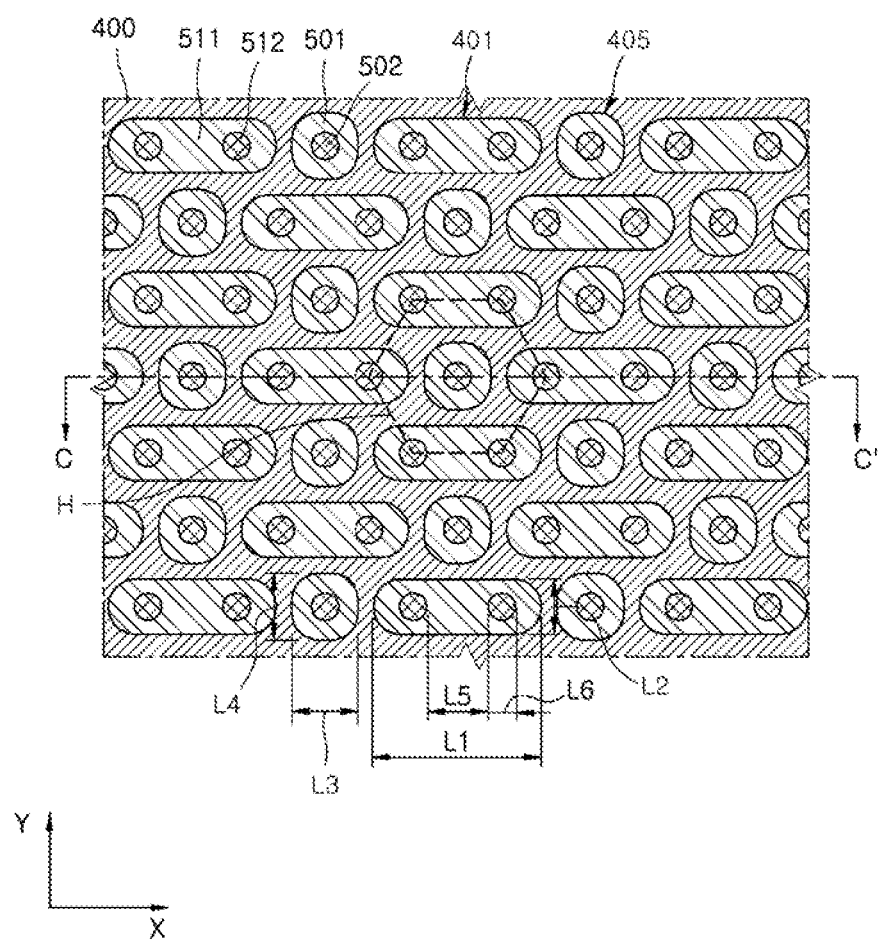
Figure 11:
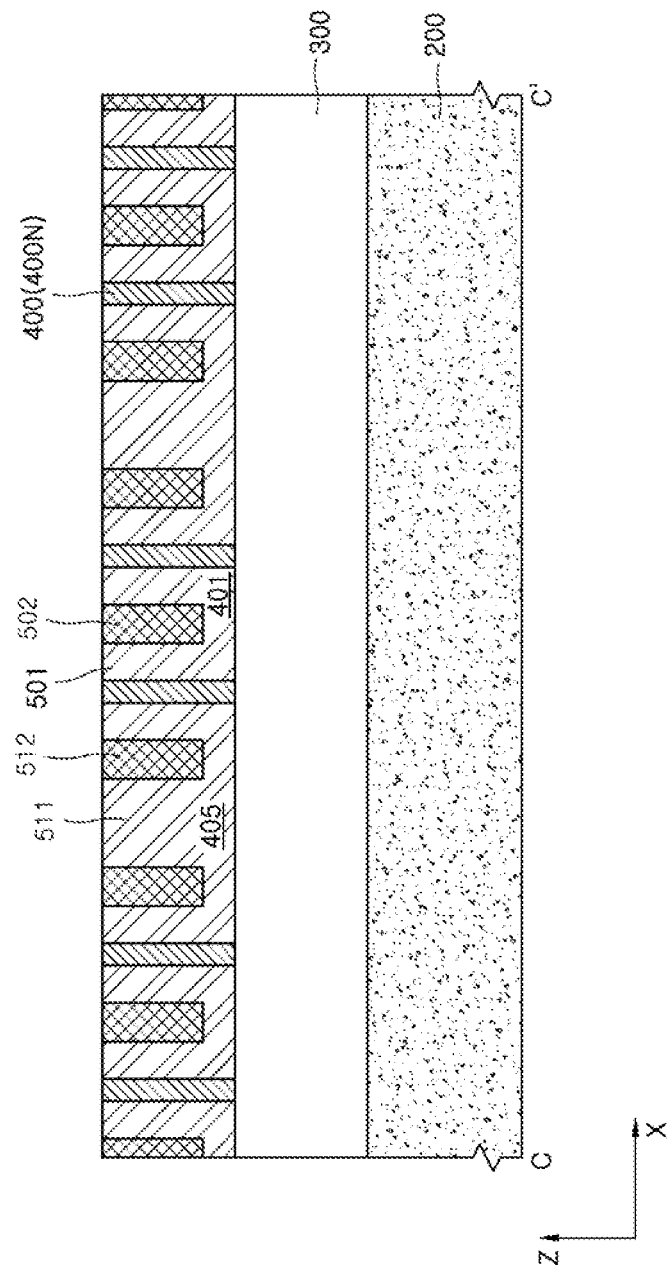

FIGS. 10 and 11 illustrate a step of phase-separating the BCP layer 500, and FIG. 11 is a cross-sectional view taken along the line C-C' in FIG. 10.

As shown in FIGS. 10 and 11, the BCP layer 500 filling the first windows 405 and the second windows 401 may be phase-separated using an annealing process. By the phase-separation, a portion of the BCP layer 500 filling the first windows 405 may be phase-separated into first matrixes 501 and first domains 502 phase-separated from the first matrixes 501. The first domain 502 may correspond to the domain 'A' of FIG. 20, and the first matrix portion 501 may correspond to the domain 'B' of FIG. 20.

By the phase-separation, a portion of the BCP layer 500 filling the second windows 401 may be phase-separated into second matrixes 511 and second domains 512 phase-separated from the second matrixes 511. The second domains 512 may correspond to the domain 'A' of FIG. 20, and the second matrixes 511 may correspond to the domain 'B' of FIG. 20.

The narrow widths L3 and L4 of the first windows 405 may limit the number of the first domains 502. Due to the narrow widths L3 and L4 of the first window 405, only one first domain 502 is formed in the first windows 405. The guide lattice 400 limiting the size of the first window 405 may serve as a guide to limit the number of the first domains 502. If the opened space of the first window 405 is too large, undesirable parasitic domains may be generated, and if the first window 405 is too small, the first domain 502 may not be formed or the size of the first domain 502 may be too small. The first window 405 may be set so that only one first domain 502 is formed in the first windows 405.

The size of the second window 401 may be defined by the long width L1 and the short width L2. The short width L2 of the second window 401 may be set to be substantially the same as the size of the width L3 of the first window 401. Accordingly, the size of the second window 401 may depend on the size of the long width L2 of the second window 401. The size of the long width L2 of the second window 401 may be limited so that a plurality of the second domains 512 can be formed in the second window 401.

The size of the second window 401 may be controlled so that only two second domains 512 may be formed in the second window 401. When the second domain 512 has a width L6 and spacing distance L5, the spacing distance L5 may be greater than the width L6 of the second domain 512 and smaller than the major axis width L1 of the second window 401. The guide lattice 400 limiting the size of the second windows 401 may limit the second domains so that only two second domains 512 are formed in the second window 401. The second window 401 may be set such that the two second domains 512 are formed in the second window 401.

The second domains 512 may be located at the vertices of a hexagon, and the first domains 501 may be located inside the hexagon. Accordingly, the first and second domains 502, 512 form the honeycomb array H so that the maximum numbers of the domains are arranged in a limited area. The arranging position of the first domains 502 and the second domains 512 may be set or limited by the arrangement of the guide lattice 400 and the ellipse pillar (100 of FIG. 1).

As shown in FIG. 11, each of the second domain 512 and the first domain 502 may be formed in phase-separated portions in the first matrix portion 501 and the second matrix portion 511. Side surfaces and bottom surfaces of the second domains 512 and the first domains 502 may have shapes surrounded by the first matrixes 501 and the second matrixes 511, respectively.

Figure 12:
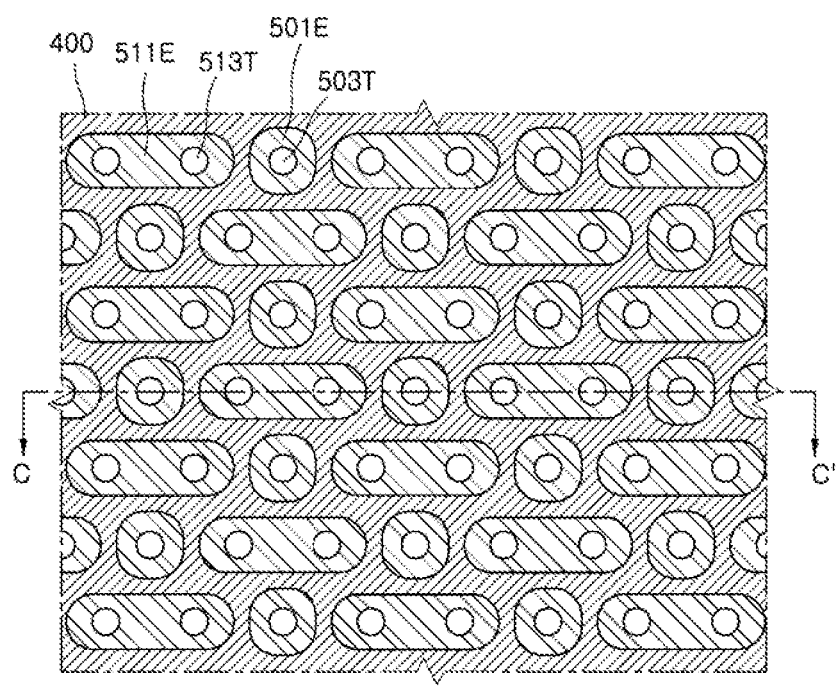
Figure 13:
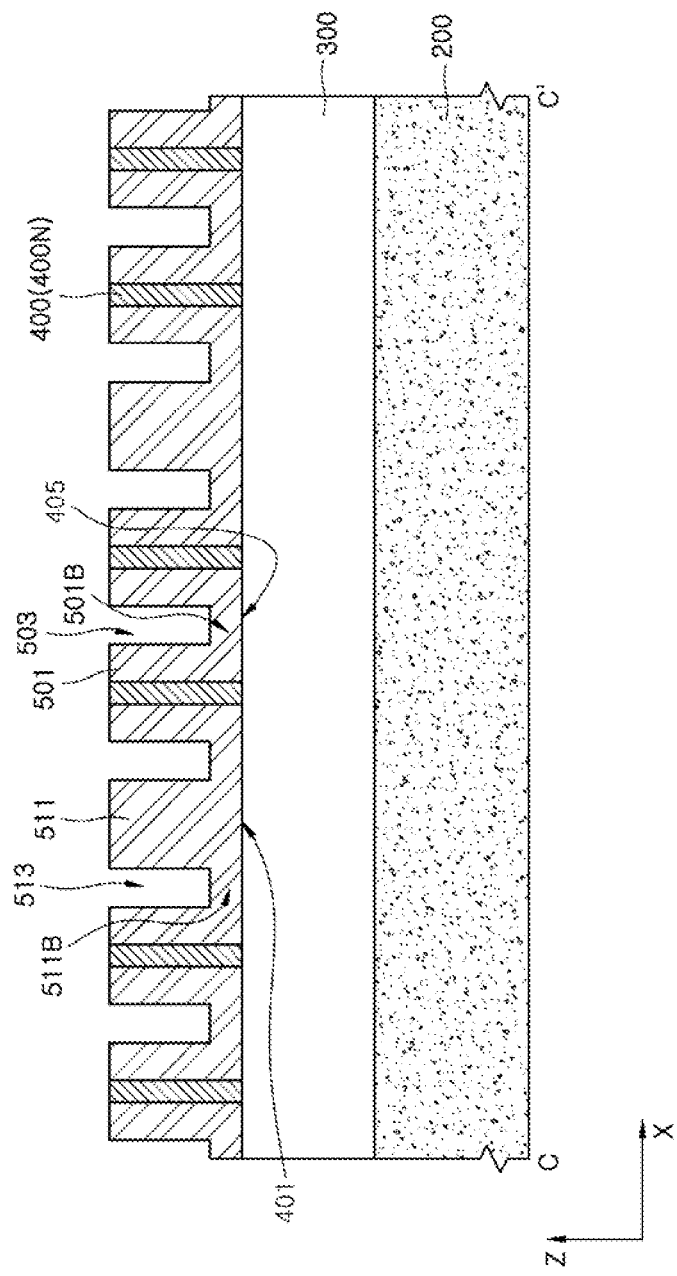
Figure 14:
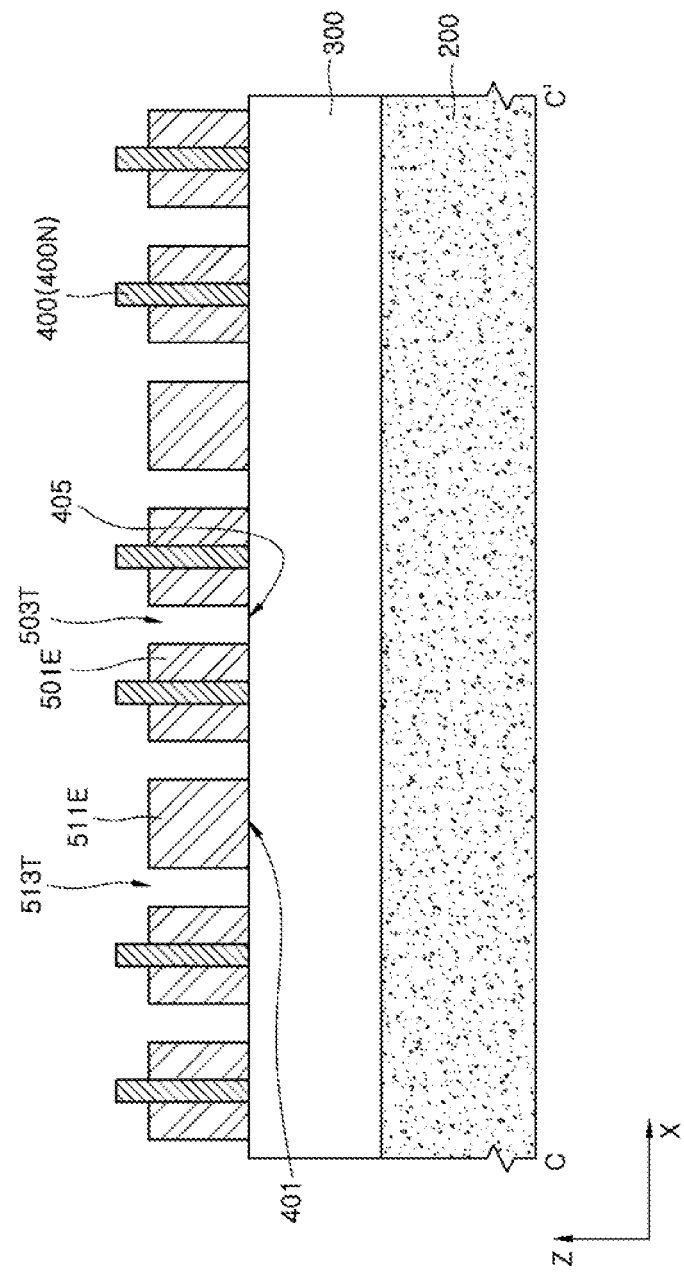

FIGS. 12 to 14 illustrate a step of forming first and second through holes 503T and 513T, and FIGS. 13 and 14 are cross-sectional view taken along the line C-C' of FIG. 12.

As shown in FIG. 13, the first and second domains (502, 512 of FIG. 10) are selectively removed to form first openings 503 and second openings 513. As the first domains (502 of FIG. 10) are selectively removed, bottom portions 501B of the first matrixes 501 located below the bottoms of the first domains (502 of FIG. 10) may be exposed to the bottoms of the first openings 503. Also, as the second domains (512 of FIG. 10) are selectively removed, bottom portions 511B of the second matrixes 511 located below the bottoms of the second domains (512 of FIG. 10) may be exposed to the bottoms of the second openings 513.

As shown in FIGS. 12 and 14, the first openings (503 of FIG. 13) and the second openings (513 of FIG. 13) extend to penetrate the bottom portions 501B of the first matrixes and the bottom portions 511B of the second matrixes to form first through holes 503T extending from the first openings 503 and second through holes 513T extending from the second openings 513, respectively.

The process to form the first through holes 503T and the second through holes 513T may include an etch back or an anisotropic etching against the first and second matrixes 501, 511 in which the first and second openings 503, 513 are formed. Upper portions of the first and second matrixes 501, 511 are partially etched in the process to extend the first through holes 503T and the second through holes 513T, thus forming first matrixes 501E and second matrixes 511E that have lowered heights. The first through holes 503T and the second through holes 513T may be formed to substantially and completely penetrate the first matrixes 501E and the second matrixes 511E.

Figure 15:
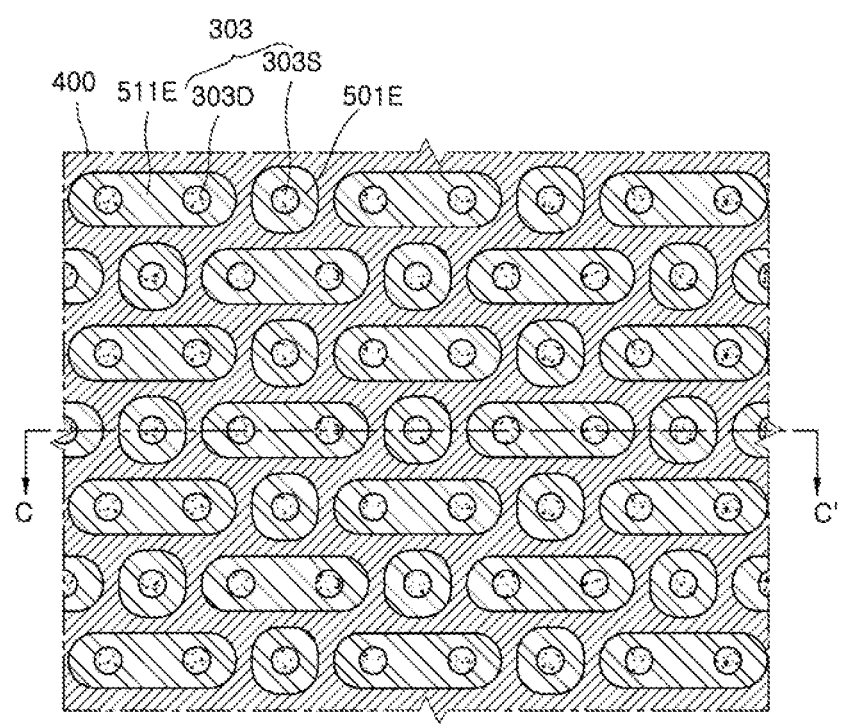
Figure 16:
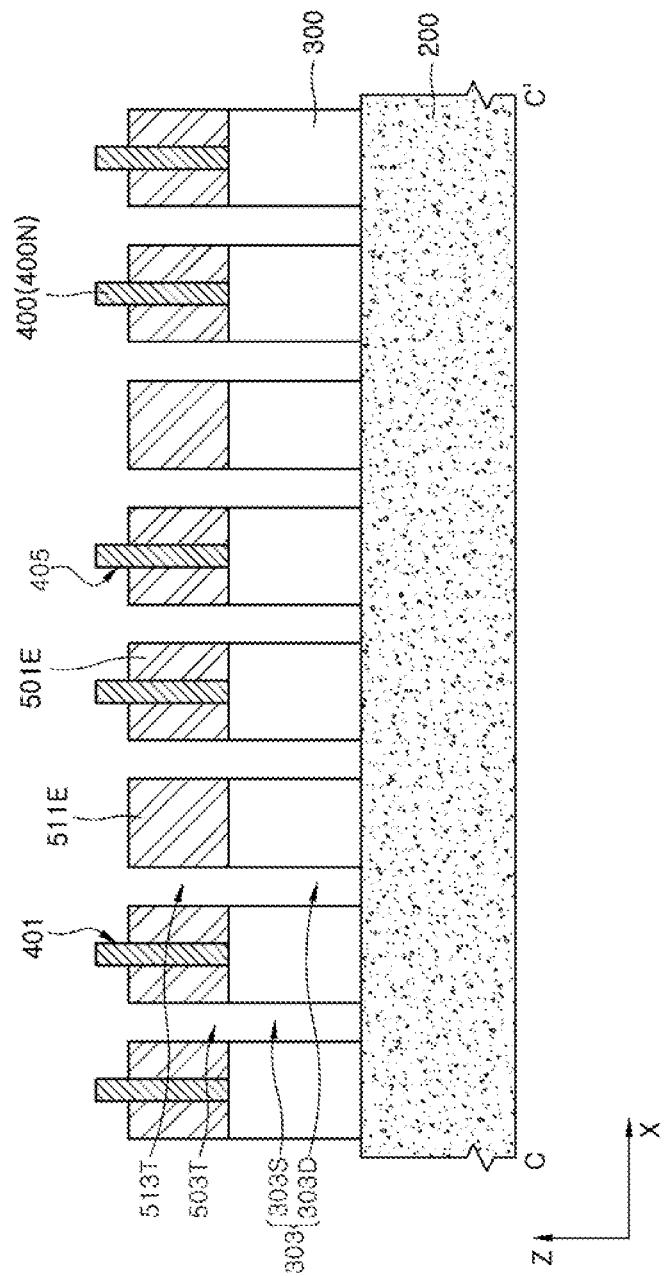

FIGS. 15 and 16 illustrate a step of forming third and fourth through holes 303S, 303D. The third and fourth through holes, in combination, may be referred to as through holes 303. FIG. 16 is a cross-sectional view taken along the line C-C' of FIG. 15.

As shown in FIGS. 15 and 16, the through holes 303 including the third through holes 303S and the fourth through holes 303D substantially penetrating the underlying layer 300 are formed by extending the first through holes 503T and the second through holes 513T to penetrate the underlying layer 300. The exposed portions of the underlying layer 300 exposed to the bottoms of the first through holes 503T and the second through holes 513T are selectively etched and removed using the first matrixes 501E, the second matrixes 511E and the guide lattice 400 as etch masks. The exposed portions of the underlying layer 300 are selectively removed, and thus arrays of the third through holes 303S extending from the first through holes 503T and the fourth through holes 303S extending from the second through holes 513T are formed on the underlying layer 300.

Figure 17:
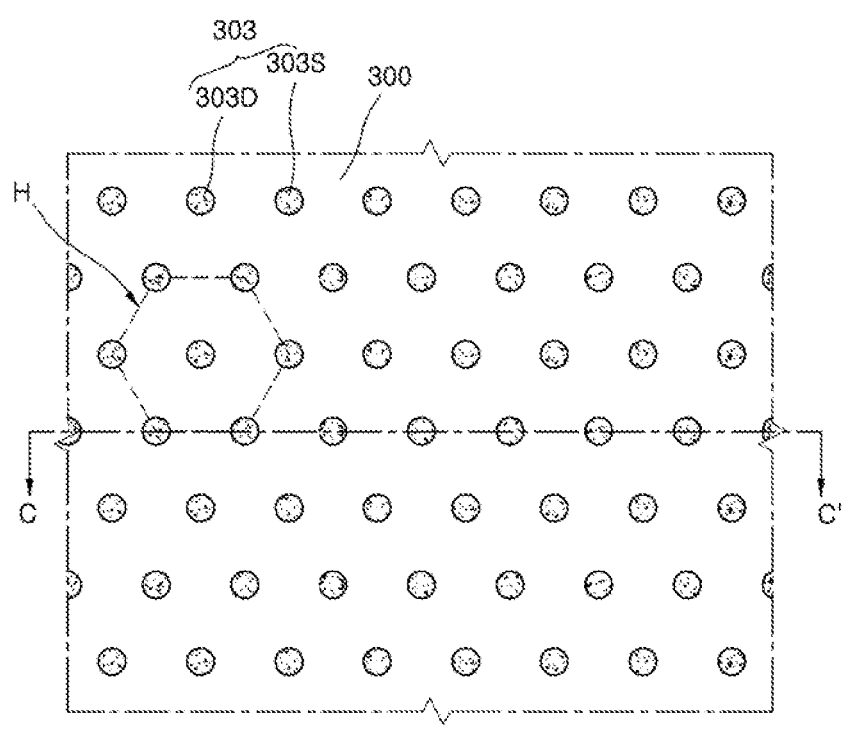
Figure 18:
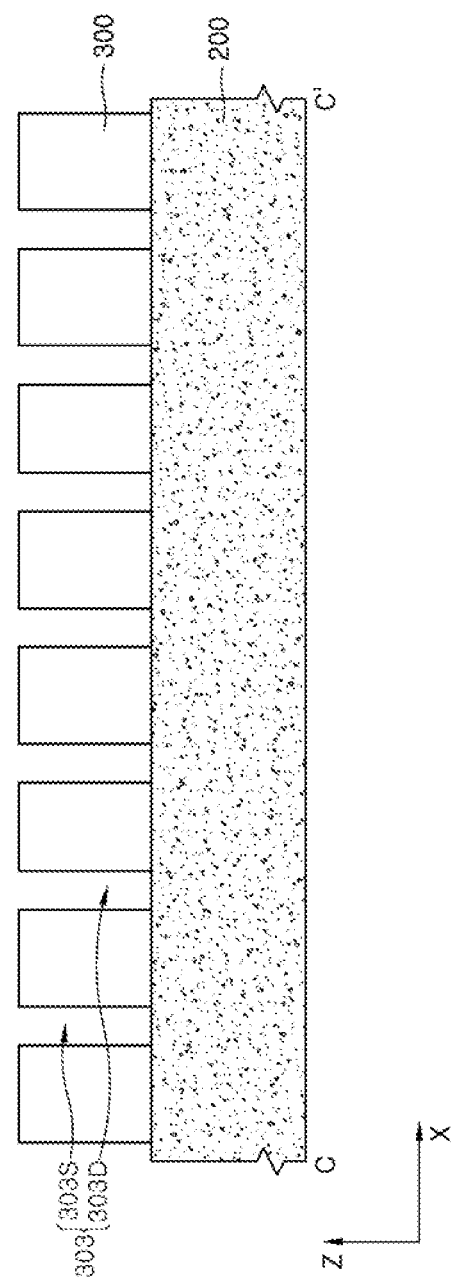

FIGS. 17 and 18 illustrate a step of removing the guide lattice (400 of FIG. 15), and FIG. 18 is a cross-sectional view taken along the line C-C' of FIG. 16.

As shown in FIGS. 17 and 18, the underlying layer 300 is exposed by selectively removing the first matrixes 501E, the second matrixes 511E and the guide lattice 400. The underlying layer 300 may have an array of the through holes 303, and the through holes 303 may be arranged in the honeycomb array H. The arrangement of the through holes 303 may be used to form connecting contacts in an interconnection structure in a memory device such as a DRAM or a logic device. Also, the arrangement of the through holes 303 may be used to form bottom electrodes of capacitor structures of the DRAM device in pillar shapes or cylindrical shapes. The arrangement of the through holes 303 may be used to form a memory device having a feature of cross point arrangement.

According to the embodiments described-above, it is possible to easily form nano-scale structures or nano structures on a large-sized substrate using a phase-separation technique of a BCP layer. The nano-structures may be used in fabrication of polarizing plates including a line grid, formation of a reflective lens of a reflection type liquid crystal display or the like. The nano-structures may not only be used in fabrication of the independent polarizing plate, but also in formation of a polarizing unit which is integral with a display panel. For example, the nano-structures may be used in the process to directly form the polarizing unit on an array substrate including thin film transistors, or a color filter substrate. The nano-structures may be used in the mold for manufacturing a nanowire transistor and memory, a mold for the electrical and electronic components such as a nanostructure for patterning a conductive line of nano-scale, a mold for manufacturing a catalytic of a solar cell and a fuel cell, a mold for fabricating an etching mask and an organic light emitting diode (OLED) cell, and a mold for manufacturing a gas sensor.

The above-described methods and structures of the present disclosure may be used in fabrication of integrated circuit (IC) chips. The resulting IC chips may be supplied to users in a raw wafer form, in a bare die form, or in a package form by a manufacturer. The IC chips may also be provided in a single chip package form or in a multi-chip package form. In addition, a single IC chip may be integrated in intermediate products such as mother boards or end products to constitute other signal processing devices. The end products may be any product that includes IC chips, and may include toys, low end application products, or high end application products such as computers. For example, the end products may include display units, keyboards, or central processing units (CPUs).

Embodiments of the present disclosure have been disclosed above for illustrative purposes. Those skilled in the art will appreciate that various modifications, additions and substitutions are possible, without departing from the scope and spirit of the present disclosure as disclosed in the accompanying claims.

What is claimed is:

1. A method for forming patterns, the method comprising:
    forming ellipse pillars over an underlying layer, wherein the pillars, in combination, form a diamond array so that a separation space is located in a center of the diamond array;
    forming a guide lattice surrounding the pillars in a substantially conformal manner so that a first window is defined in the separation space;
    removing the pillars to form second windows;
    forming a block copolymer layer filling the first and second windows;
    phase-separating the block copolymer layer in the first window into a first domain and a first matrix;
    phase-separating the block copolymer layer in each of the second windows into a plurality of second domains and a second matrix; and
    removing the first domain and the plurality of second domains to form a first opening and a plurality of second openings, respectively.

2. The method of claim 1,
    wherein the pillars include first, second, third, and fourth pillars,
    wherein each of the pillars includes a nose side and a long side,
    wherein the long side is continuously connected to the nose side,
    wherein nose sides of the first and the second pillars face each other, and
    wherein long sides of the third and the fourth pillars face each other.

3. The method of claim 1,
    wherein each of the pillars has a first width in a major axis direction and a second width in a minor axis direction, and wherein the first width and the second width are different from each other.

4. The method of claim 3,
wherein the separation space has a third width,
wherein the first width is larger than the third width, and
wherein the second width is smaller than third width.

5. The method of claim 1, wherein forming the guide lattice includes:
forming a guide layer covering the pillars; and
performing an anisotropic etching to the guide layer to form the guide lattice.

6. The method of claim 1,
wherein each of the pillars has an ellipse shape, and
wherein major axis of the pillars extend in the same direction as each other.

7. The method of claim 1,
wherein the number of the plurality of second domains formed in each of the second windows is two.

8. The method of claim 1,
wherein the plurality of second domains formed in the second windows, in combination, form a hexagon pattern, and
wherein the first domain is located at a center of the hexagon pattern.

9. The method of claim 1, further includes:
patterning the underlying layer to form through holes,
wherein the through holes extend from the first opening and the plurality of second openings.

10. The method of claim 9,
wherein the through holes are formed by etching the underlying layer using the first and second matrixes and the guide lattice, in combination, as an etching mask.

11. A method for forming patterns, the method comprising:
forming a guide lattice over an underlying layer so that a first window and a plurality of second windows are defined over the underlying layer, wherein the plurality of second windows, in combination, form a diamond pattern, wherein each of the second windows has an elongated configuration, wherein the first window is located at a center of the diamond pattern;
forming a block copolymer layer filling the first window and the plurality of second windows;
phase-separating the block copolymer layer in the first window into a first domain and a first matrix;
phase-separating the block copolymer layer in each of the second windows into a plurality of second domains and a second matrix; and
removing the first domain and the plurality of second domains to form a first opening and a plurality of second openings, respectively.

12. The method of claim 11,
wherein the number of the plurality of second windows is four,
wherein each of the plurality of second windows has a nose side and a long side,
wherein the long side is continuously connected to the nose side,
wherein the nose sides of two of the plurality of second windows face the first window, and
wherein the long sides of the remaining two second windows face the first window.

13. The method of claim 11,
wherein each of the plurality of the second windows has a major axis width and a minor axis width, and
wherein the major axis width is different from the minor axis width.

14. The method of claim 13,
wherein the first window has a first width,
wherein the major axis width is greater than the first width, and
wherein the minor axis width is smaller than the first width.

15. The method of claim 14,
wherein the first window is a circle hole or a square hole.

16. The method of claim 13,
wherein major axis of the plurality of second windows extend in the same direction as each other.

17. The method of claim 11,
wherein the number of the plurality of second domains formed in each of the second windows is two.

18. The method of claim 11,
wherein the plurality of second domains formed in the second windows, in combination, form a hexagon pattern, and
wherein the first domain is located at a center of the hexagon pattern.

19. The method of claim 11, further includes:
patterning the underlying layer to form through holes,
wherein the through holes extend from the first opening and the second openings.

20. A method for manufacturing patterns, the method comprising:
forming ellipse pillars over an underlying layer so that a separation space is defined between the pillars;
forming a guide lattice surrounding the pillars so that a first window is formed in the separation space;
removing the pillars to form second windows;
forming block copolymer layer filling the first window and the second windows;
phase-separating the block copolymer layer in the first window into a first domain and a first matrix;
phase-separating the block copolymer layer in each of the second windows into a plurality of second domains and a second matrix; and
removing the first domain and the second domains to form a first opening and a plurality of second openings, respectively.

* * * * *